(12) United States Patent
Sun

(10) Patent No.: US 11,171,815 B2
(45) Date of Patent: Nov. 9, 2021

(54) DIGITAL EQUALIZER WITH OVERLAPPABLE FILTER TAPS

(71) Applicant: CREDO TECHNOLOGY GROUP LIMITED, Grand Cayman (KY)

(72) Inventor: Junqing Sun, Fremont, CA (US)

(73) Assignee: CREDO TECHNOLOGY GROUP LIMITED, Grand Cayman (KY)

( * ) Notice: Subject to any disclaimer, the term of this patent is extended or adjusted under 35 U.S.C. 154(b) by 0 days.

(21) Appl. No.: 16/748,594

(22) Filed: Jan. 21, 2020

(65) Prior Publication Data

US 2021/0226824 A1    Jul. 22, 2021

(51) Int. Cl.
*H04L 25/03* (2006.01)
*H04L 27/01* (2006.01)
*H03H 21/00* (2006.01)

(52) U.S. Cl.
CPC ... *H04L 25/03057* (2013.01); *H03H 21/0012* (2013.01); *H04L 25/03878* (2013.01); *H04L 27/01* (2013.01); *H04L 2025/0349* (2013.01)

(58) Field of Classification Search
CPC ......... H04L 25/03057; H04L 25/03878; H04L 27/01; H03H 21/0012
See application file for complete search history.

(56) References Cited

U.S. PATENT DOCUMENTS

| | | | | |
|---|---|---|---|---|
| 4,761,796 A | * | 8/1988 | Dunn | H04B 1/69 375/133 |
| 4,964,118 A | * | 10/1990 | Aly | H04B 3/235 370/291 |
| 4,995,031 A | * | 2/1991 | Aly | H04B 3/235 370/286 |
| 5,159,282 A | * | 10/1992 | Serizawa | H04L 1/0001 329/316 |

(Continued)

FOREIGN PATENT DOCUMENTS

| | | | | |
|---|---|---|---|---|
| CN | 102104506 A | * | 6/2011 | ......... H04L 63/1416 |
| CN | 108809372 A | * | 11/2018 | ............. H04B 7/065 |

OTHER PUBLICATIONS

Agrawal, Ankur, et al.; A 19-GB/s Serial Link Receiver With Both 4-Tap FFE and 5-Tap DFE Functions in 45-nm SOI CMOS; IEEE J. Solid-State Circuits; Dec. 2012; pp. 3220-3231; vol. 47 No. 12. (Year: 2012).*

(Continued)

*Primary Examiner* — Berhanu Tadese
(74) *Attorney, Agent, or Firm* — Ramey & Schwaller LLP

(57) ABSTRACT

In one illustrative embodiment, an equalizer includes: a shift register, an array of multipliers, an array of multiplexers, and a summer. The shift register provides receive signal samples at each tap. Each multiplier in the array multiplies one of said receive signal samples by a respective coefficient to produce a product, with at least one of said multipliers (Continued)

coupled to a fixed tap. Each multiplexer in the array supplies an associated one of said multipliers with a receive signal sample from a selectable tap. The summer sums the products to produce a filtered output signal. To reduce hardware requirements, coefficient multipliers may be multiplexed to a reduced set of taps, and the dynamic range of the coefficients may be increased by overlapping the sets for different multipliers. Methods of tap selection and coefficient adaptation are disclosed.

17 Claims, 7 Drawing Sheets

(56) References Cited

U.S. PATENT DOCUMENTS

| | | | | |
|---|---|---|---|---|
| 5,283,531 | A * | 2/1994 | Serizawa | H04L 1/0001 329/316 |
| 5,475,710 | A * | 12/1995 | Ishizu | H04L 25/03057 375/232 |
| 5,517,527 | A * | 5/1996 | Yu | H04B 3/142 375/233 |
| 5,541,956 | A * | 7/1996 | Ueda | H04B 7/082 375/232 |
| 5,689,528 | A * | 11/1997 | Tsujimoto | H01Q 3/2605 333/18 |
| 6,233,107 | B1 * | 5/2001 | Minuhin | G11B 5/09 360/51 |
| 6,272,173 | B1 * | 8/2001 | Hatamian | G01R 31/3004 375/229 |
| 6,414,990 | B1 * | 7/2002 | Jonsson | H04L 7/0058 375/232 |
| 6,459,746 | B2 * | 10/2002 | Agazzi | G01R 31/3004 370/516 |
| 6,535,553 | B1 * | 3/2003 | Limberg | H04L 27/01 348/614 |
| 6,744,806 | B1 * | 6/2004 | Moore | H04B 1/707 375/130 |
| 6,771,725 | B2 * | 8/2004 | Agazzi | G01R 31/3004 331/2 |
| 6,876,618 | B2 * | 4/2005 | Tonami | G11B 20/10009 369/124.05 |
| 6,940,898 | B2 * | 9/2005 | Shanbhag | H03H 21/0012 375/229 |
| 6,963,617 | B1 * | 11/2005 | Armour | H04L 25/03057 375/260 |
| 7,010,064 | B2 * | 3/2006 | Penther | H04L 1/0066 375/229 |
| 7,035,330 | B2 * | 4/2006 | Shanbhag | H03H 21/0012 375/229 |
| 7,039,104 | B2 * | 5/2006 | Shanbhag | H03H 21/0012 375/232 |
| 7,054,088 | B2 * | 5/2006 | Yamazaki | G11B 5/09 360/39 |
| 7,120,193 | B2 * | 10/2006 | Ibragimov | H03H 21/0012 375/233 |
| 7,266,145 | B2 * | 9/2007 | Balasubramonian | H03H 21/0012 375/229 |
| 7,409,019 | B2 * | 8/2008 | Hsu | H03F 1/3241 375/229 |
| 7,483,480 | B2 * | 1/2009 | Guo | H04L 25/03044 375/232 |
| 7,496,298 | B2 * | 2/2009 | Chen | H04B 10/2513 398/149 |
| 7,504,976 | B1 * | 3/2009 | Pelion | H04L 27/36 341/143 |
| 7,590,204 | B2 * | 9/2009 | Monsen | H04L 25/03057 375/350 |
| 8,040,973 | B2 * | 10/2011 | Harwood | H04L 25/08 375/296 |
| 8,112,004 | B2 * | 2/2012 | Ishibashi | H04B 10/697 398/208 |
| 8,160,179 | B2 * | 4/2012 | Forey | H04L 25/085 375/316 |
| 8,301,036 | B2 * | 10/2012 | He | H04L 25/03019 398/202 |
| 8,446,941 | B2 * | 5/2013 | Yang | H04L 25/0307 375/233 |
| 8,582,635 | B2 * | 11/2013 | Prokop | H04L 25/03044 375/229 |
| 8,693,596 | B1 * | 4/2014 | Warner | H03G 3/00 375/345 |
| 8,730,077 | B2 * | 5/2014 | Bailey | G11B 20/10046 341/155 |
| 9,059,889 | B2 * | 6/2015 | Nazarathy | H04L 27/3818 |
| 9,071,479 | B2 * | 6/2015 | Qian | H04L 25/03057 |
| 9,313,017 | B1 * | 4/2016 | Liao | H04L 7/0062 |
| 9,385,859 | B2 * | 7/2016 | Kuan | H04L 7/0087 |
| 9,716,529 | B1 * | 7/2017 | Dai | H04B 3/04 |
| 9,935,800 | B1 * | 4/2018 | He | H04L 27/01 |
| 10,069,660 | B1 * | 9/2018 | Sun | H04L 25/14 |
| 10,212,260 | B2 * | 2/2019 | Sun | H04L 69/18 |
| 10,313,165 | B2 * | 6/2019 | Cheng | H03F 3/45201 |
| 10,728,059 | B1 | 7/2020 | Sun et al. | |
| 10,992,501 | B1 * | 4/2021 | Sun | H03L 7/081 |
| 2006/0088091 | A1 * | 4/2006 | Jeon | H04N 5/211 375/233 |
| 2007/0025224 | A1 * | 2/2007 | Tatsuzawa | G11B 20/10222 369/59.22 |
| 2013/0343400 | A1 * | 12/2013 | Lusted | H04L 12/413 370/419 |
| 2014/0086264 | A1 * | 3/2014 | Lusted | H04L 69/14 370/470 |
| 2014/0146833 | A1 * | 5/2014 | Lusted | H04L 12/413 370/437 |
| 2015/0003505 | A1 * | 1/2015 | Lusted | H04L 25/4917 375/224 |
| 2016/0028562 | A1 * | 1/2016 | Dallaire | H04L 25/061 375/233 |
| 2016/0337114 | A1 * | 11/2016 | Baden | H04J 3/0697 |
| 2017/0237587 | A1 * | 8/2017 | Hildinger | H04L 25/4975 370/201 |
| 2018/0062885 | A1 * | 3/2018 | London | H04B 10/501 |
| 2018/0097669 | A1 * | 4/2018 | He | H04B 3/04 |
| 2018/0262374 | A1 * | 9/2018 | Cheng | H03F 3/193 |
| 2019/0305992 | A1 * | 10/2019 | Olmos | H04L 25/03057 |
| 2020/0076651 | A1 * | 3/2020 | Sun | G06N 20/00 |
| 2021/0226824 | A1 * | 7/2021 | Sun | H04L 25/03057 |

OTHER PUBLICATIONS

Agrawal et al., A 19-Gbs Serial Link Receiver With Both 4-Tap FFE and 5-Tap DFE Functions in 45-nm SOI CMOS, IEEE Dec. 2012 (Year: 2012).*

M. S. Faruk and S. J. Savory, "Digital Signal Processing for Coherent Transceivers Employing Multilevel Formats," in Journal of Lightwave Technology, vol. 35, No. 5, pp. 1125-1141, Mar. 1, 2017, doi: 10.1109/JLT.2017.2662319. (Year: 2017).*

S. Kwon and H. Bae, "Variable-Precision Distributed Arithmetic (VPDA) MIMO Equalizer for Power-and-Area-Efficient 112 GB/s Optical DP-QPSK Systems," in Journal of Lightwave Technology, vol. 31, No. 2, pp. 282-294, Jan. 15, 2013, doi: 10.1109/JLT.2012.2230244. (Year: 2013).*

U.S. Appl. No. 16/552,927, filed Aug. 27, 2019, entitled "Serdes Pre-Equalizer Having Adaptable Preset Coefficient Registers".

U.S. Appl. No. 16/459,512, filed Jul. 1, 2019, entitled "Parallel Mixed-Signal Equalization for High-Speed Serial Link".

Non-Final Office Action dated Dec. 30, 2019 for U.S. Appl. No. 16/459,512.

U.S. Appl. No. 16/691,523, filed Nov. 21, 2019, entitled "Multi-Function Level Finder for Serdes".

Final Office Action dated Feb. 4, 2021 in corresponding U.S. Appl. No. 16/552,927.

* cited by examiner

Fig. 7A
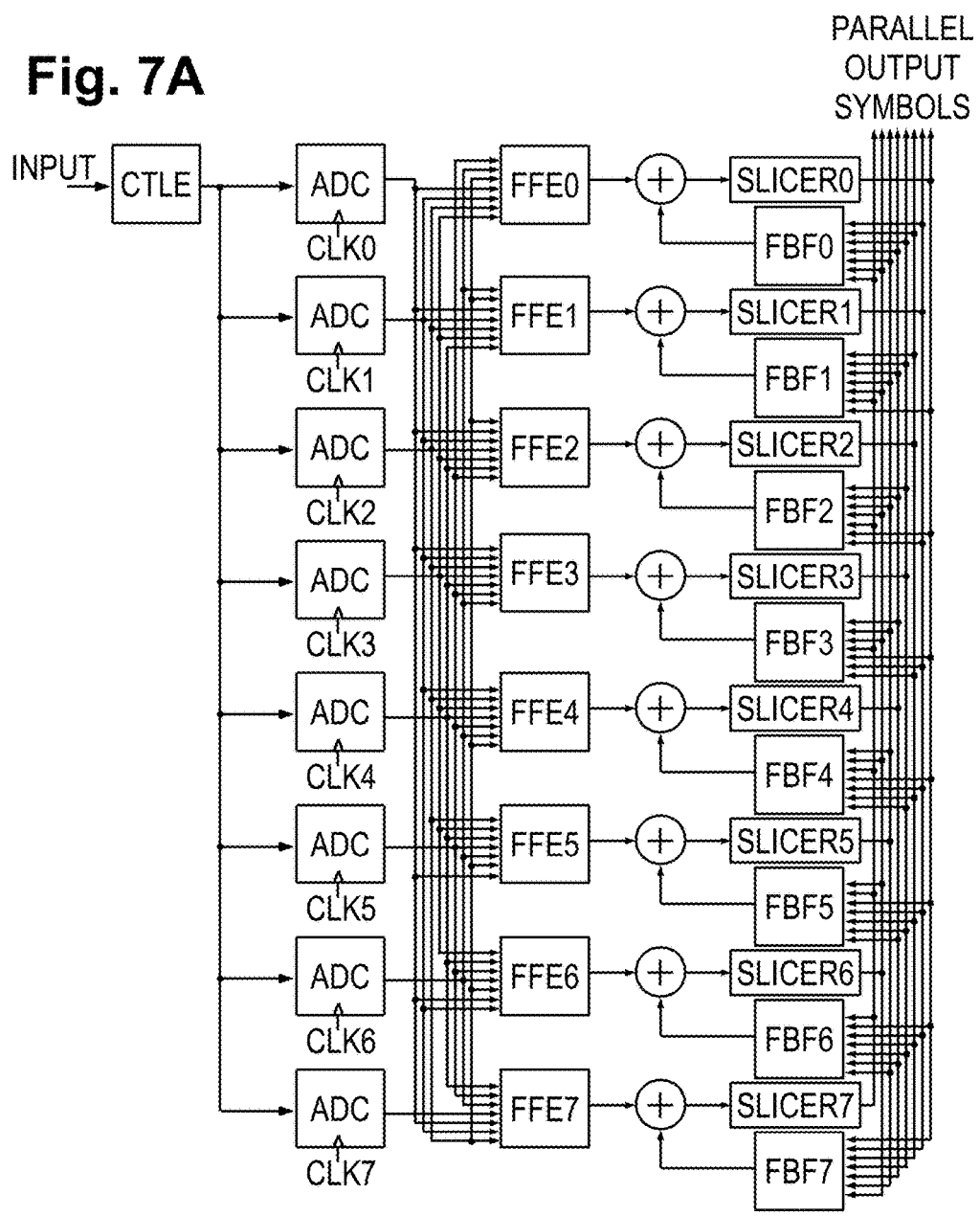
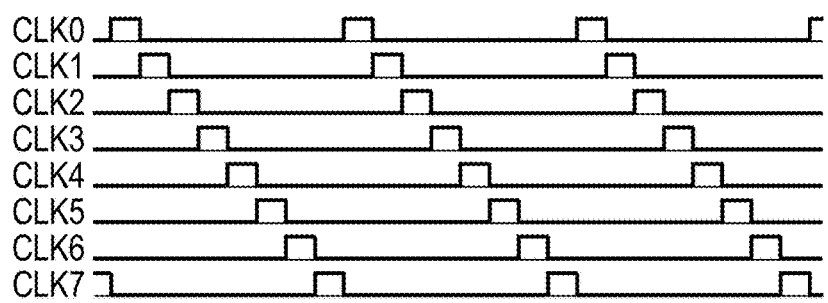
Fig. 7B

DIGITAL EQUALIZER WITH OVERLAPPABLE FILTER TAPS

BACKGROUND

Digital communications occur between sending and receiving devices over an intermediate communications medium, or "channel" (e.g., a fiber optic cable or insulated copper wires). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by sequences of two or more symbols.

Many digital communication links use only one bit per symbol; a binary '0' is represented by one symbol (e.g., an electrical voltage or current signal within a first range), and a binary '1' by another symbol (e.g., an electrical voltage or current signal within a second range), but higher-order signal constellations are known and frequently used. In 4-level pulse amplitude modulation (PAM4), each symbol interval may carry any one of four symbols, denoted as −3, −1, +1, and +3. Two binary bits can thus be represented by each symbol.

Channel non-idealities produce dispersion which may cause each symbol to perturb its neighboring symbols, a consequence termed "inter-symbol interference" (ISO. ISI can make it difficult for the receiving device to determine which symbols were sent in each interval, particularly when such ISI is combined with additive noise.

To combat noise and ISI, receiving devices may employ various equalization techniques. Linear equalizers generally have to balance between reducing ISI and avoiding noise amplification. Decision Feedback Equalizers (DFE) are often preferred for their ability to combat ISI without inherently amplifying the noise. As the name suggests, a DFE employs a feedback path to remove ISI effects derived from previously-decided symbols. Whichever equalizer is used must contend with ever-increasing levels of ISI, and must complete their processing in ever-decreasing symbol intervals. As symbol rates reach into the tens of gigabaud over long-reach channels, receiver designs are employing increasing degrees of parallelism, often increasing the power consumption requirements to undesirable levels.

SUMMARY

Accordingly, there is provided herein digital equalizer apparatus, methods, and systems, with movable taps. In one illustrative embodiment, an equalizer includes: a shift register, an array of multipliers, an array of multiplexers, and a summer. The shift register provides receive signal samples at each tap. Each multiplier in the array multiplies one of said receive signal samples by a respective coefficient to produce a product, with at least one of said multipliers coupled to a fixed tap. Rach multiplexer in the array supplies an associated one of said multipliers with a receive signal sample from a selectable tap. The summer sums the products to produce a filtered output signal.

An illustrative equalization method includes: providing a shift register having receive signal samples available at each tap; providing an array of multipliers, each multiplier multiplying one of said receive signal samples by a respective coefficient to produce a product, with at least one of said multipliers coupled to a fixed tap; coupling each multiplexer in an array of multiplexers to an associated one of said multipliers to supply that multiplier with a receive signal sample from a selectable tap; and providing a summer that sums the products to produce a filtered output signal.

Another illustrative equalization method embodiment includes: periodically sampling an analog receive signal to fill a shift register with receive signal samples; forming a weighted sum of the receive signal samples with a feed forward equalizer employing selectable taps from the shift register; combining the weighted sum with a feedback signal to form a combined signal; and deriving sequences of symbol decisions from the combined signal using a decision element.

Each of the foregoing embodiments may be implemented individually or conjointly, and together with any one or more of the following features in any suitable combination: 1. a summation element that combines the filtered output signal with a feedback signal to produce a combined signal; a decision element that operates on the combined signal to produce a sequence of symbol decisions; and a feedback filter that derives the feedback signal from the sequence of symbol decisions. 2. the array of multipliers is one of a plurality of multiplier arrays each associated with a respective array of multiplexers and a respective summer operating on offset taps from the shift register to provide multiple filtered output signals in parallel. 3. a plurality of summation elements that each combines a filtered output signal with a respective feedback signal to produce a respective combined signal; a plurality of decision elements that each operates on the respective combined signals to collectively produce a sequence of symbol decisions; and a plurality of feedback filters that each derives the respective feedback signals from the sequence of symbol decisions. 4. each multiplexer in said array selects only from non-adjacent taps of the shift register. 5. at least one of the selectable taps is shared by multiple multiplexers in said array. 6. said multiple multiplexers concurrently select said at least one of the selectable taps to increase an effective dynamic range for a respective coefficient. 7. circuitry that sets or adapts the coefficients for multipliers coupled to a fixed tap before determining which selectable taps the multiplexers select. 8. the circuitry measures equalization error and correlates the equalization error with symbol decisions in said sequence to adapt the coefficients for said array of multipliers. 9. the method includes setting or adapting the coefficients for multipliers coupled to a fixed tap before determining which selectable taps the multiplexers select.

BRIEF DESCRIPTION OF THE DRAWINGS

FIG. 7A is a block diagram of an illustrative parallelized decision feedback equalizer implementation.

FIG. 7B is a signal diagram of illustrative clock signals for the parallelized DFE implementation.

DETAILED DESCRIPTION

Figure 1:
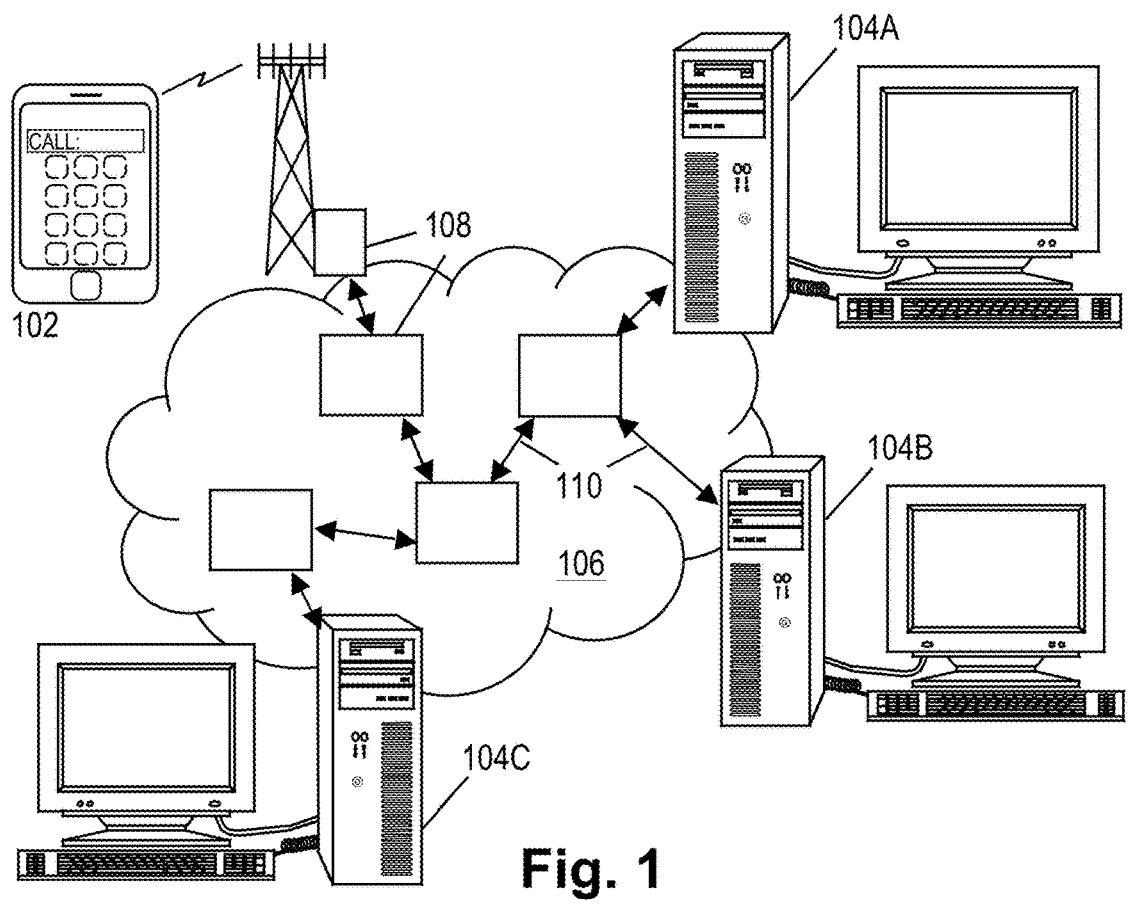
FIG. 1 shows an illustrative computer network.

Note that the specific embodiments given in the drawings and following description do not limit the disclosure. On the contrary, they provide the foundation for one of ordinary skill to discern the alternative forms, equivalents, and modifications that are encompassed in the claim scope.

The disclosed apparatus and methods are best understood in the context of the larger environments in which they operate. Accordingly, FIG. 1 shows an illustrative communications network 100 including mobile devices 102 and computer systems 104A-C coupled via a routing network 106. The routing network 106 may be or include, for example, the Internet, a wide area network, or a local area network. One specific communications network example is the network employed with a data center to connect the servers to each other and to the external telecommunications infrastructure. In FIG. 1, the routing network 106 includes a network of equipment items 108, such as switches, routers, and the like. The equipment items 108 are connected to one another, and to the computer systems 104A-C, via point-to-point communication links 110 that transport data between the various network components.

Figure 2:
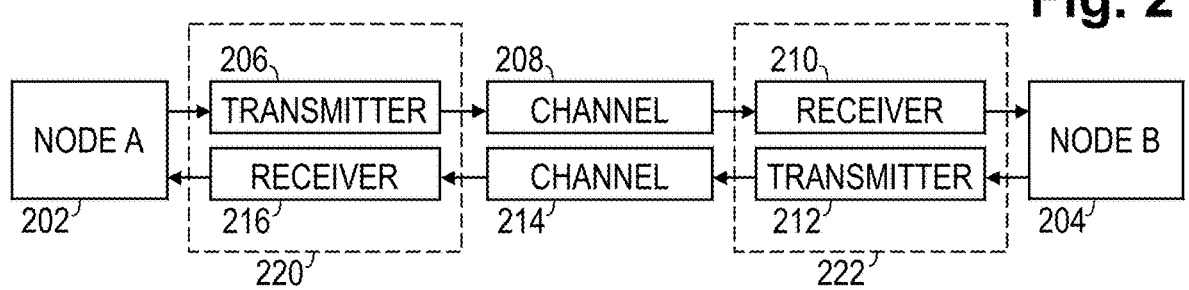
FIG. 2 is a block diagram of an illustrative point-to-point communication link.

FIG. 2 is a diagram of an illustrative point-to-point communication link that may be representative of links 110 in FIG. 1. The illustrated embodiment includes a first node 202 ("Node A") in communication with a second node 204 ("Node B"). Nodes A & B can each be, for example, any one of mobile devices 102, equipment items 108, computer systems 104A-C, or other sending/receiving devices suitable for high-rate digital data communications.

Coupled to Node A is a transceiver 220, and coupled to Node B is a transceiver 222. Communication channels 208 and 214 extend between the transceivers 220 and 222. The channels 208 and 214 may include, for example, transmission media such as fiber optic cables, twisted pair wires, coaxial cables, backplane transmission lines, and wireless communication links. (It is also possible for the channel to be a magnetic or optical information storage medium, with the write-read transducers serving as transmitters and receivers.) Bidirectional communication between Node A and Node B can be provided using separate channels 208 and 214, or in some embodiments, a single channel that transports signals in opposing directions with minimal interference.

A transmitter 206 of the transceiver 220 receives data from Node A and transmits the data to the transceiver 222 via a signal on the channel 208. The channel signal may be, for example, an electrical voltage, an electrical current, an optical power level, a wavelength, a frequency, or a phase value. A receiver 210 of the transceiver 222 receives the signal via the channel 208, uses the signal to reconstruct the transmitted data, and provides the data to Node B. Similarly, a transmitter 212 of the transceiver 222 receives data from Node B and transmits the data to the transceiver 220 via a signal on the channel 214. A receiver 216 of the transceiver 220 receives the signal via the channel 214, uses the signal to reconstruct the transmitted data, and provides the data to Node A.

Figure 3:
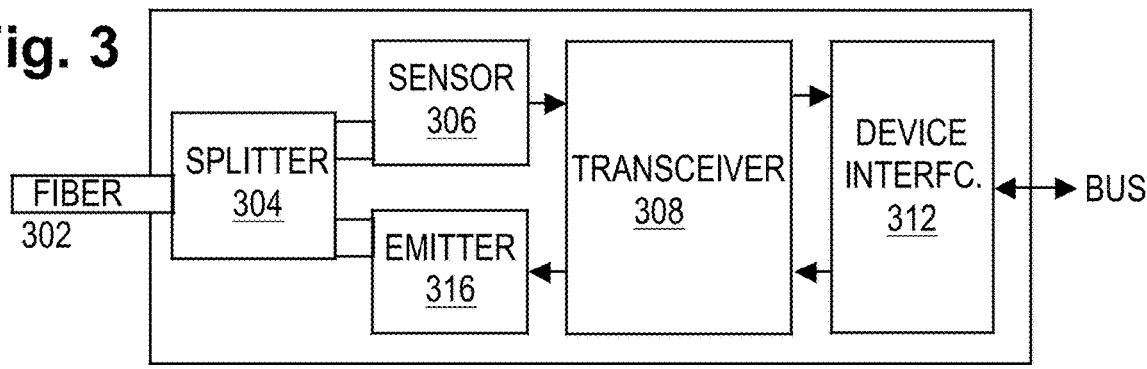
FIG. 3 is a block diagram of an illustrative fiber optic interface module.

FIG. 3 shows an illustrative transceiver embodiment in the context of a fiber optic interface module. An optical fiber 302 couples to the fiber optic interface module via a splitter 304 which creates two optical paths to the fiber: one for receiving and one for transmitting. A sensor 306 is positioned on the receiving path to convert one or more received optical signals into corresponding analog (electrical) receive signals that are equalized and demodulated by a receiving portion of transceiver 308 to provide a sequence of symbol decisions to a device interface 312. The device interface 312 buffers the sequence of symbol decisions and, in at least some embodiments, includes forward error correction (FEC) decoding and payload extraction logic to derive a received data stream from the sequence of symbol decisions. The device interface 312 then makes the received data stream available to the host node via an internal data bus in accordance with a standard I/O bus protocol.

Conversely, data for transmission can be communicated by the host node via the bus to device interface 312. In at least some embodiments, the device interface 312 packetizes the data with appropriate headers and end-of-frame markers, optionally adding a layer of FEC coding and/or a checksum. A transmit portion of transceiver 308 accepts a transmit data stream from interface 312 and converts the transmit data stream into an analog electrical drive signal for emitter 316, causing the emitter to generate optical channel signals that are coupled via splitter 304 to the optical fiber 302.

In at least some contemplated embodiments, elements 308-312 are integrated into a monolithic transceiver chip together with a controller that provides link training and flow control logic. Additional detail for such embodiments is provided in co-pending application U.S. application Ser. No. 16/552,927, "SerDes pre-equalizer having adaptable preset coefficient registers", which is hereby incorporated herein by reference in its entirety. Alternatively, the device interface 312 may incorporate the controller functionality. Regardless, the transceiver may be employed for communications over optical fiber, electrical conductors, wireless links, or other channel types.

Figure 4:
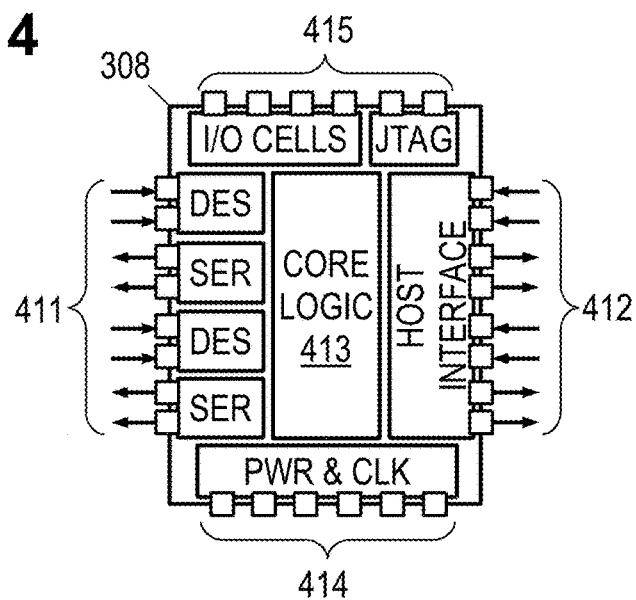
FIG. 4 is a block diagram of an illustrative application specific integrated circuit with serializer/deserializer transceivers.

FIG. 4 is a block diagram of an illustrative monolithic transceiver chip 308. Chip 308 includes SerDes modules with contacts 411 for receiving and transmitting high-rate serial bitstreams across four lanes in each direction, a host interface module with contacts 412 for exchanging high-rate digital data streams with the host, and core logic 413 for implementing a channel communications protocol while buffering data in each direction. Also included are various supporting modules and contacts 414, 415, for functions such as power regulation and distribution, clock generation, digital input/output lines for control, and a JTAG module for built-in self testing. The chip designer can design the device by placing the predefined modular units for the serializers, deserializers, power, clock generator, I/O cells, and JTAG; and routing the interconnections between the modular units with a bit of supporting logic.

The "deserializer" implements the receiving function of the chip 308, implementing any suitable equalization technique, e.g., linear equalization, partial response equalization, or decision feedback equalization (DFE), so as to combat the intersymbol interference (151) that results from signal dispersion in the channel. In many cases, DFE is preferred and will be used here to provide context for explaining operation of the movable filter taps disclosed herein.

Figure 5:
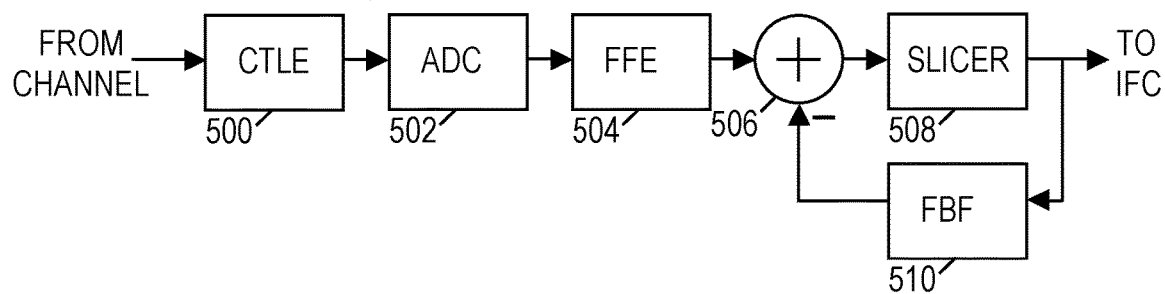
FIG. 5 is a block diagram of an existing decision feedback equalizer implementation.

FIG. 5 shows an illustrative implementation of the receive chain. The analog channel signal is filtered by a continuous time linear equalizer (CTLE) 500 to attenuate out-of-band noise and to optionally provide some spectral shaping to improve a response to high-frequency components of the receive signal. An analog-to-digital converter (ADC) 502 is provided to digitize the receive signal, and a digital filter (also known as a feed-forward equalizer or FFE) 504 performs further equalization to further shape the overall channel response of the system and minimize the effects of leading ISI on the current symbol. As part of the shaping of the overall channel response, the FFE 504 may also be designed to shorten the channel response of the filtered signal while minimizing any attendant noise enhancement.

A summer 506 subtracts an optional feedback signal from the output of FFE 504 to minimize the effects of trailing ISI on the current symbol, yielding an equalized signal that is coupled to a decision element ("slicer") 508. The decision element includes one or more comparators that compare the equalized signal to corresponding decision thresholds to determine for each symbol interval which constellation symbol the signal's value most closely corresponds to. The equalized signal may also be termed a "combined signal" herein.

The decision element 508 accordingly produces a sequence of symbol decisions (denoted Ak, where k is the time index). In certain contemplated embodiments, the signal constellation is a bipolar (non-return-to-zero) constellation representing −1 and +1, necessitating one comparator using a decision threshold of zero. In certain other contemplated embodiments, the signal constellation is PAM4 (−3, −1, +1, +3), necessitating three comparators employing the respective decision thresholds −2, 0, and +2. (The unit for expressing symbol and threshold values is omitted for generality, but for explanatory purposes may be presumed to be volts. In practice, a scale factor will be employed.) The comparator outputs can be taken collectively as a thermometer-coded digital representation of the output symbol decision, e.g., with 000 representing −3, 100 representing −1, 110 representing +1, and 111 representing +3. Alternatively, the comparator outputs could be converted into a binary or Gray-coded representation.

A feedback filter (FBF) 510 derives the feedback signal using a series of delay elements (e.g., latches, flip flops, or registers) that store the recent output symbol decisions ($A_{k-1}$, $A_{k-2}$, ..., $A_{k-N}$, where N is the number of filter coefficients $f_i$). Each stored symbol is multiplied with a corresponding filter coefficient $f_i$, and the products are combined to obtain the feedback signal.

As an aside, we note here that the receiver also includes a timing recovery unit and a filter coefficient adaptation unit, but such considerations are addressed in the literature and are well known to those skilled in the art. Nevertheless, we note here that at least some contemplated embodiments include one or more additional comparators in the decision element 508 to be employed for comparing the combined signal to one or more of the symbol values, thereby providing an error signal that can be used for timing recovery with, e.g., a "bang-bang" design. We further note that the adaptation unit may employ the error signal to adapt the coefficients of both FFE 504 and FBF 510 during a training phase when a known symbol sequence is employed. The decision element 508 may include additional comparators to "unroll" one or more taps of the feedback filter, providing speculative decisions to a multiplexing arrangement as described in, e.g., U.S. Pat. No. 8,301,036 ("High-speed adaptive decision feedback equalizer") and U.S. Pat. No. 9,071,479 ("High-speed parallel decision feedback equalizer"), which are each incorporated herein by reference in their entireties.

Figure 6:
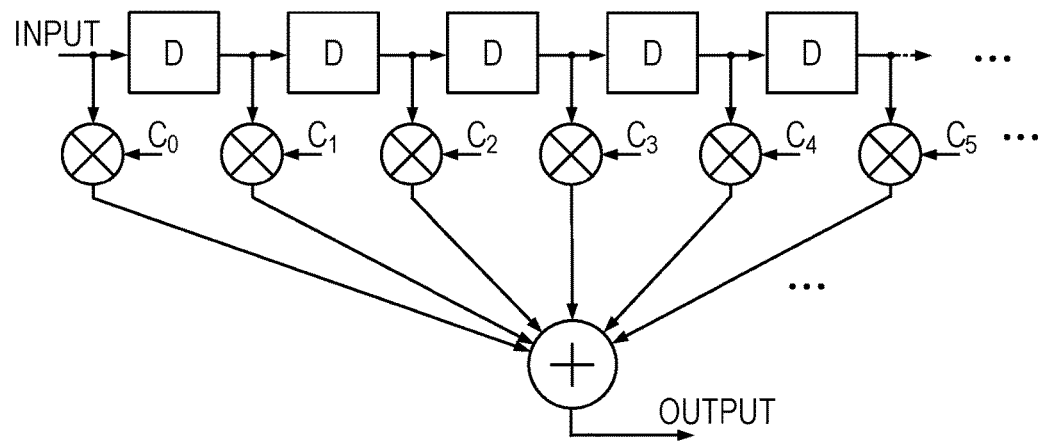
FIG. 6 is a block diagram of an existing linear filter implementation.

FIG. 6 shows a conventional implementation of a filter which in many cases might be suitable for use as FFE 504 or FBF 510. An input signal for the filter is supplied to shift register implemented as a sequence of latches or other delay elements D. A first of the delay elements captures the input signal value once in each symbol interval while outputting the captured value from the preceding symbol interval. Each of the other delay elements captures the held value from the preceding element, repeating the operation to provide increasingly delayed input signal values. A set of multipliers scales each of the input values in the sequence, supplying the scaled values to a summer that outputs the sum of the scaled input values. This output is also referred to herein as a weighted sum.

The filter implementation of FIG. 6 may be suitable for relatively small filters (less than, say, four or five taps), but as the size of the filter grows, so too does the number of operations that must be performed in each symbol interval. As the symbol interval grows shorter, completion of all the required operations becomes more challenging.

Accordingly, FIG. 7A shows a parallelized equalizer implementation (including the optional feedback filters for DFE). As with the implementation of FIG. 5, the CTLE 500 filters the channel signal to provide a receive signal, which is supplied in parallel to an array of analog-to-digital converters (ADCs). Each of the ADC elements is provided with a respective clock signal, each of the clock signals having a different phase, causing the elements in the array to take turns sampling and digitizing the receive signal, so that only one of the ADC element outputs is transitioning at any given time. See FIG. 7B for an illustration of how the clock signals are shifted in phase relative to each other. Note that the clock duty cycle shown is merely illustrative; the point meant to be conveyed by the diagram is the sequential nature of transitions in the different clock signals.

An array of FFEs (FFE0 through FFE7), each form a weighted sum of the ADC element outputs. The weighted sums employ filter coefficients that are cyclically shifted relative to each other. FFE0 operates on the held signals from the 3 ADC elements operating prior to CLK0, the ADC element responding to CLK0, and the 3 ADC elements operating subsequent to CLK0, such that during the assertion of CLK4, the weighted sum produced by FFE0 corresponds to the output of FFE 504 (FIGS. 5 and 6). FFE1 operates on the held signals from the 3 ADC elements operating prior to CLK1, the ADC element responding to CLK1, and the 3 ADC elements operating subsequent to CLK1, such that during the assertion of CLK5, the weighted sum corresponds to that of FFE 504. And the operation of the remaining FFEs in the array follows the same pattern with the relevant phase shifts. In practice, the number of filter taps may be smaller, or the number of elements in the array may be larger, so as to offer a longer window of valid output.

As with the receiver of FIG. 5, a summer may combine the output of each FFE with a feedback signal to provide an equalized signal to a corresponding decision element. FIG. 7A shows an array of decision elements (Slicer0 through Slicer7), each operating on an equalized signal derived from a respective FFE output. As with the decision element of FIG. 5, the illustrated decision elements employ comparators to determine which symbol the equalized signal most likely represents. The decisions are made while the respective FFE outputs are valid (e.g., Slicer0 operates while CLK4 is asserted, Slicer1 operates while CLK5 is asserted, etc.). Preferably the decisions are provided in parallel on an output bus to enable a lower clock rate to be used for subsequent operations.

An array of feedback filters (FBF0 through FBF7) operates on the preceding symbol decisions to provide the feedback signals for the summers. As with the FFEs, the inputs for the FBFs are shifted cyclically and provide a valid output only when the inputs correspond to the contents of the FBF 510 (FIG. 5), coinciding with the time window for the corresponding FFE. In practice, the number of feedback filter taps may be smaller than what is shown, or the number of array elements may be larger, so as to offer a longer window of valid output.

Figure 8:
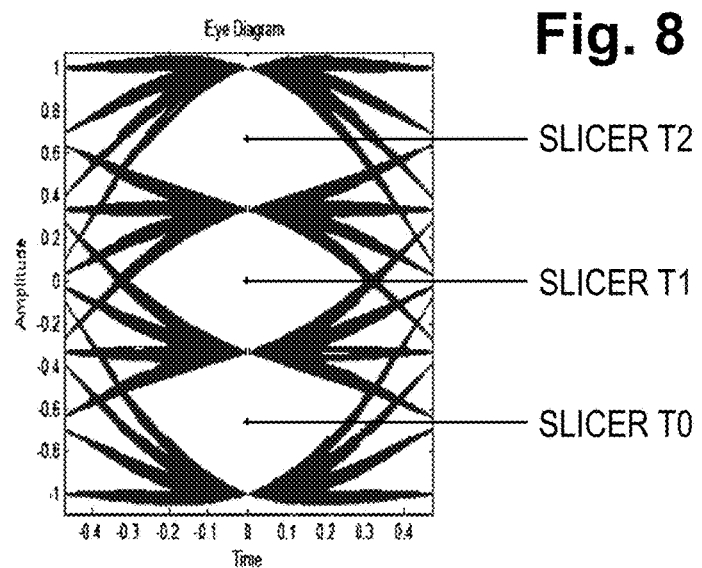
FIG. 8 is an illustrative PAM4 eye diagram.

As with the decision element of FIG. 5, the decision elements in FIG. 7A may each employ additional comparators to provide timing recovery info, coefficient training info, and/or precomputation to unroll one or more taps of the feedback filter. FIG. 8 shows an illustrative eye diagram for a PAM4 signal constellation with nominal signal values −1, −0.5, +0.5, and +1 representing the four symbols. In the illustrative eye diagram, the equalized signal values actually fall at −0.98, −0.36, +0.36, and +0.98, placing the optimal decision thresholds at T0=−0.67, T1=0, and T2=+0.67. Additional comparator thresholds could be provided at E0=−0.36 and E1=+0.36 to provide error signals for coefficient training and timing recovery.

Figure 9:
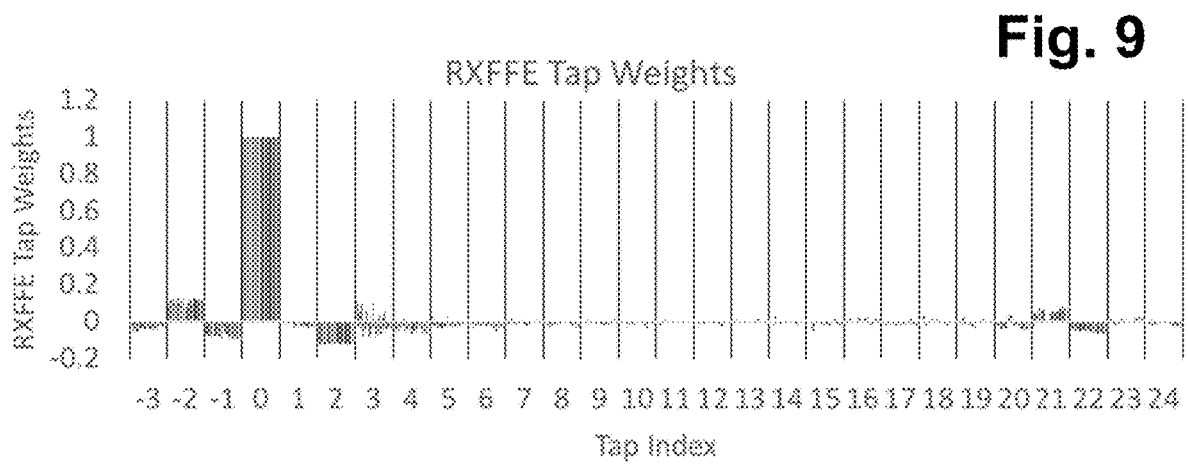
FIG. 9 is a bar graph of linear filter tap weights for an ensemble simulation.

The FFE coefficients need to be enough to cover channel-dependent reflections and channel loss. Reflections are usually caused by vias, connectors, or packages, each of which are subject to production variation. FIG. 9 is a graph of FFE tap coefficients $C_{-3}$ through $C_{24}$ derived in an ensemble simulation of a short channel, accounting for such packaging and connection variations. The $C_0$ tap is fixed at unity, and the tap weights outside the window from $C_{-3}$ to $C_4$ are negligible except for a reflection that appears in the $C_{20}$ through $C_{23}$ window. The exact position of the reflection can vary significantly, however, and it is undesirable to implement an FFE with much over 20 taps at a high data rate with a high degree of parallelism, as the FFE's power consumption would dwarf that of the remaining circuitry.

Figure 10:
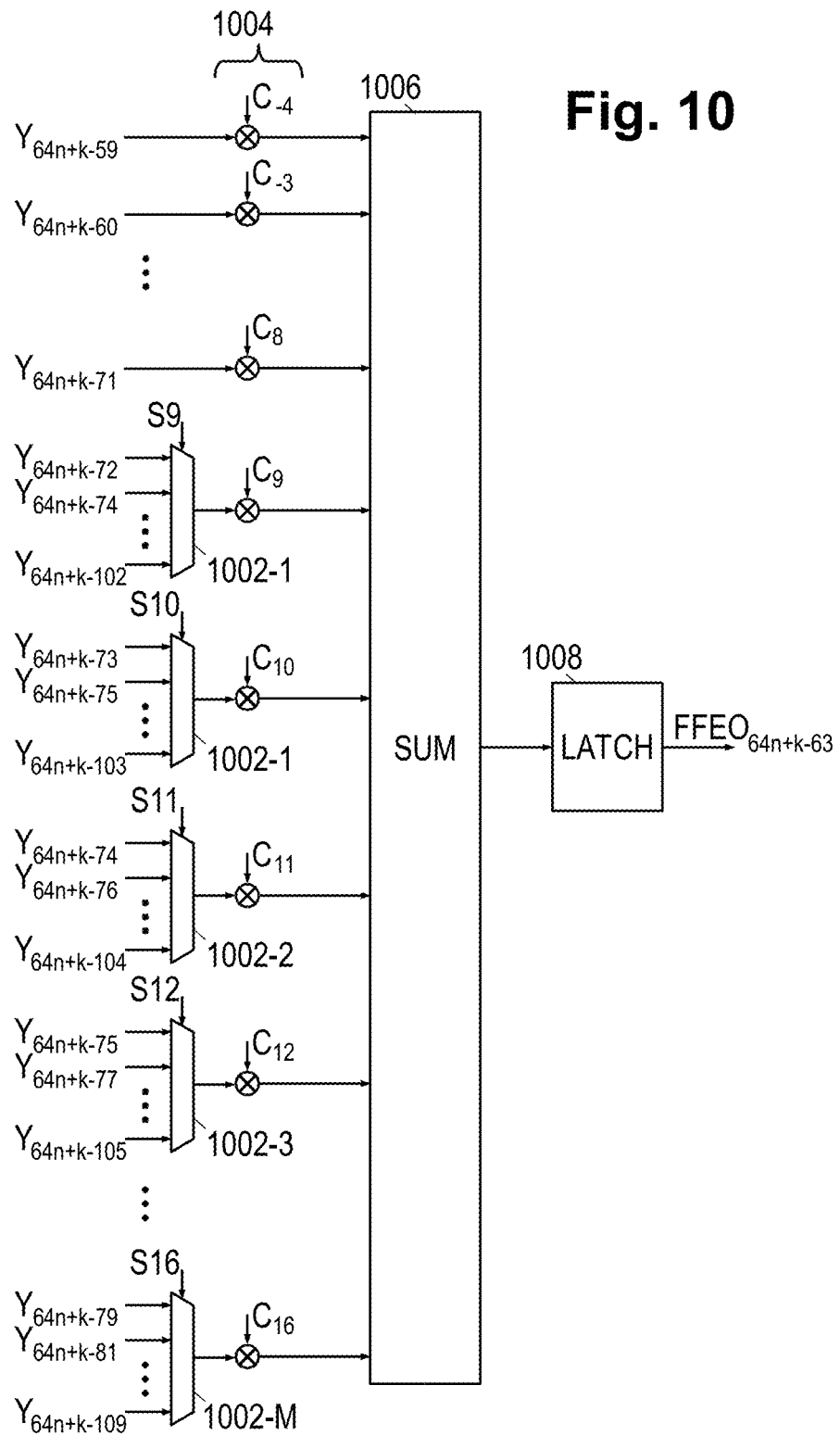
FIG. 10 is a block diagram of an illustrative linear filter with movable taps.

Accordingly, the FFE implementation of FIG. 10 limits the number of tap coefficients to 21 ($C_{-4}$ through $C_{16}$) but employs a set of multiplexers 1002-1 through 1002-M to enable some of the coefficients (e.g., $C_9$ through $C_{16}$) to be repositioned. For clarity, only one FFE is illustrated in FIG. 10; in practice, multiple such FFEs would be implemented in parallel as suggested in FIG. 7A, with each FFE coupled to receive the delayed receive signal samples from a window around an associated cursor location. The cursor location for the FFE of FIG. 10 is 64n+k−63, where the receive signal samples are made available in parallel batches of 64, n is the batch number, and k is the FFE number between 0 and 63, inclusive. The illustrated window of receive signal samples is $Y_{64n+k-109}$ through $Y_{64n+k-59}$, or in terms of offsets from the cursor, from −46 through +4.

To reduce routing complexity and multiplexer circuitry, each multiplexer in the set may be configured to select from even offsets or odd offsets. Thus, e.g., multiplexer 1002-1 is a 32-to-1 multiplexer that selects one of the receive signal samples that is offset by −9, −11, −13, . . . , −39; while multiplexer 1002-2 selects from one of the receive signal samples that is offset by −10, −12, . . . , −40. This reduced number of taps being handled by each multiplexer significantly reduces hardware requirements.

While it is possible (and contemplated in certain alternative embodiments) for each of the multiplexers in the set to have a larger degree of interleaving to select from mutually exclusive sets of receive signal samples, it is believed potentially advantageous for the sets of receive signal samples to partially overlap. Thus, multiplexer 1002-3 is shown selecting from sample offsets of −11, −13, . . . −41, and multiplexer 1002-4 would select from offsets −12, −14, . . . , −42. This pattern is continued, with the last multiplexer selecting from offsets −16, −18, . . . , −46. The mux selection signals $S_9$ through $S_{16}$ are preferably settable independent of each other, enabling multiple coefficients to be "overlapped" (i.e., to operate on a shared tap).

The potential advantage for employing partially overlapping selection sets becomes two-fold: first, backup coefficients are available if a given tap coefficient is required for a non-overlapped offset; and second, coefficients can be "stacked" to increase their dynamic range for canceling unexpectedly large reflections (or conversely, each individual coefficient can be provided with a reduced dynamic range to reduce power consumption). It is expected that with eight moveable tap coefficients, two normal reflections or one large reflection can be canceled. This ability to choose between a larger number of (non-overlapped) coefficient with a reduced dynamic range or a reduced number of (overlapping) coefficients with an increased dynamic range enables better versatility with minimal hardware complexity.

Other than the selectable inputs, the FFE implementation is similar to that of FIG. 6. Multipliers 1004 multiply each of the tapped inputs with a corresponding coefficient, and a summer 1006 sums the products. A latch 1008 captures the sum as the FFE output ("FFE0") for the current cursor position.

Though feedback filters are generally kept fairly short, the movable tap coefficient principle described above for FFE filters can also be applied to feedback filters.

Figure 11:
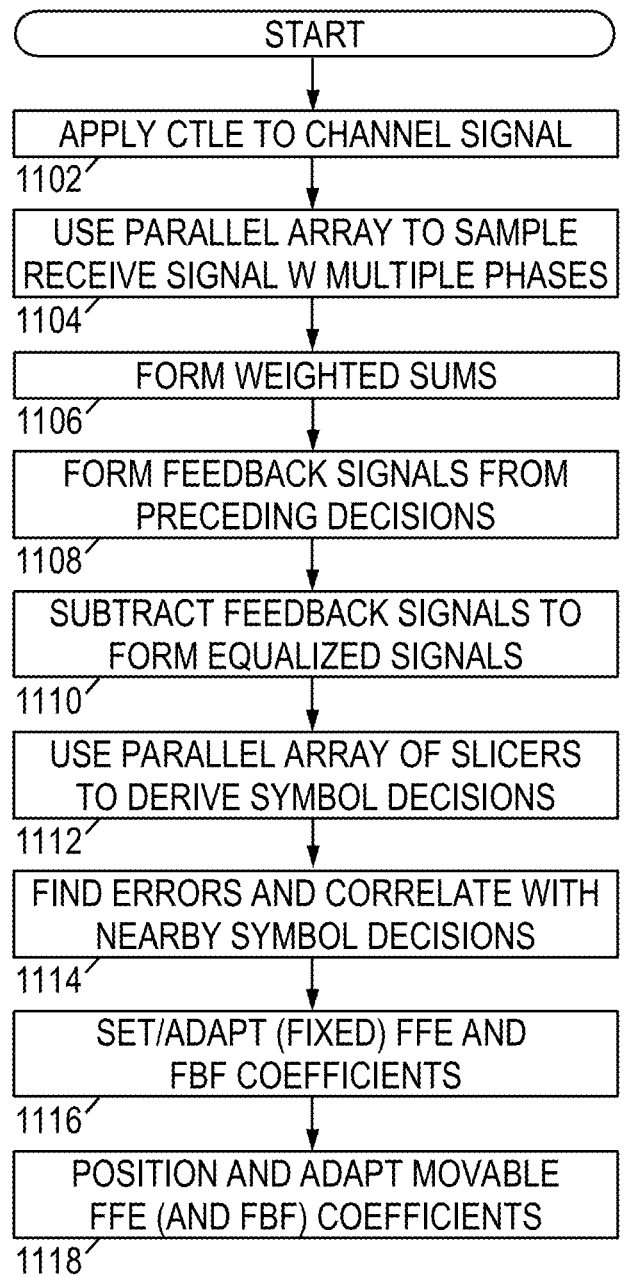
FIG. 11 is a flow diagram of an illustrative movable tap filter equalization method.

FIG. 11 is a flowchart of an illustrative equalization method which may be implemented by the receiver. In block 1102, the receiver filters the analog channel signal with a continuous time linear equalizer to form an analog receive signal. In block 1104, the receiver uses an array of ADC elements to each periodically sample the analog receive signal with different phases. In block 1106, the receiver uses an array of movable tap FFEs to form weighted sums of the held signals from the ADC element array. In block 1108, the receiver uses an array of FBFs to form feedback signals from preceding symbol decisions. In block 1110, the receiver uses an array of summers to subtract a respective feedback signal from each of the weighted sums, thereby providing a set of equalized signals that are periodically updated with different phases. In block 1112, the receiver uses an array of decision elements to derive symbol decisions from the equalized signals, and to output them in parallel.

In block 1114, the receiver compares the symbol decisions to their respective equalized signals to determine equalization errors, and the equalization errors are correlated (either in the mathematical sense or in the more general sense of identifying a tendency to vary in an associated fashion) with nearby symbol decisions. One approach to determining such correlations is set out in co-pending application Ser. No. 16/691,523, "Multi-function level finder for SerDes", filed 2019 Nov. 21 and hereby incorporated herein by reference in its entirety. Such correlations may be used in accordance with known techniques set forth in the academic literature for setting and/or adapting FFE and feedback filter coefficients in block 1116. Initially, the movable tap coefficients may be set to zero and only the fixed tap coefficients set and/or adapted. If adaptation is performed in block 1116, it may be performed for a fixed time interval or until a convergence criterion is achieved. Thereafter, in block 1118, the movable tap coefficients may be positioned at the symbol decision offsets exhibiting the largest residual ISI, and the coefficient values set or adapted in similar fashion to the fixed-tap coefficients. The coefficient positioning may be done in parallel, with all available coefficients being assigned in order to the taps having the largest residual ISI, performing adaptation, and redetermining the residual ISI. If the residual ISI for any taps is larger than the residual ISI of one or more previously-assigned coefficients, those coefficients may be re-assigned and another round of adaptation performed. The process may be repeated until the residual ISI cancellation has been maximized.

Numerous alternative forms, equivalents, and modifications will become apparent to those skilled in the art once the above disclosure is fully appreciated. Though described in the context of an optical fiber link, the disclosed principles are applicable to receivers for all types of channels. The number of taps in the FFEs and FBFs, along with the number of parallel elements in each array, are design parameters that may be tailored to the channel or context for which the receiver is designed. It is intended that the claims be interpreted to embrace all such alternative forms, equivalents, and modifications that are encompassed in the scope of the appended claims.

What is claimed is:

1. An equalizer that comprises:
   an array of delay elements providing receive signal samples at corresponding taps, the corresponding taps including one or more fixed taps and one or more selectable taps;
   an array of multipliers, each multiplier multiplying one of said receive signal samples by a respective coefficient to produce a product, with at least one of said multipliers coupled to a respective one of the fixed taps;
   an array of multiplexers, each multiplexer supplying an associated one of said multipliers with a receive signal sample from a respective one of the selectable taps; and
   a summer that sums the products to produce a filtered output signal,
      wherein at least one of the selectable taps is shared by multiple multiplexers in said array.

2. The equalizer of claim 1, wherein each multiplexer in said array selects only from non-adjacent taps of the array of delay elements.

3. The equalizer of claim 1, wherein said multiple multiplexers concurrently select said at least one of the selectable taps to increase an effective dynamic range for a respective coefficient.

4. The equalizer of claim 1, further comprising circuitry that sets or adapts the coefficients for those multipliers coupled to a fixed tap before determining which selectable taps the multiplexers select.

5. The equalizer of claim 4, wherein the circuitry measures equalization error and correlates the equalization error with symbol decisions in said sequence to adapt the coefficients for said array of multipliers.

6. The equalizer of claim 1, further comprising:
   a summation element that combines the filtered output signal with a feedback signal to produce a combined signal;
   a decision element that operates on the combined signal to produce a sequence of symbol decisions; and
   a feedback filter that derives the feedback signal from the sequence of symbol decisions.

7. The equalizer of claim 1, wherein the array of multipliers is one of a plurality of multiplier arrays each associated with a respective array of multiplexers and a respective summer operating on offset taps from the array of delay elements to provide multiple filtered output signals in parallel.

8. The equalizer of claim 7, further comprising:
   a plurality of summation elements that each combines a filtered output signal with a respective feedback signal to produce a respective combined signal;
   a plurality of decision elements that each operates on the respective combined signals to collectively produce a sequence of symbol decisions; and
   a plurality of feedback filters that each derives the respective feedback signals from the sequence of symbol decisions.

9. An equalization method that comprises:
   providing an array of delay elements having receive signal samples available at corresponding taps, the corresponding taps including one or more fixed taps and one or more selectable taps;
   providing an array of multipliers, each multiplier multiplying one of said receive signal samples by a respective coefficient to produce a product; with at least one of said multipliers coupled to a respective one of the fixed taps;
   coupling each multiplexer in an array of multiplexers to an associated one of said multipliers to supply that multiplier with a receive signal sample from a respective one of the selectable taps; and
   providing a summer that sums the products to produce a filtered output signal,
      wherein at least one of the selectable taps is shared by multiple multiplexers in said array.

10. The equalization method of claim 9, wherein each multiplexer in said array selects only from non-adjacent taps of the array of delay elements.

11. The equalization method of claim 9, wherein said multiple multiplexers concurrently select said at least one of the selectable taps to increase an effective dynamic range for a respective coefficient.

12. The equalization method of claim 9, further comprising providing circuitry that sets or adapts the coefficients for those multipliers coupled to a fixed tap before determining which selectable taps the multiplexers select.

13. The equalization method of claim 12, wherein the circuitry measures equalization error and correlates the equalization error with symbol decisions to adapt the coefficients for said array of multipliers.

14. An equalization method that comprises:
   periodically sampling an analog receive signal to fill an array of delay elements with receive signal samples;
   forming a weighted sum of the receive signal samples with a feed forward equalizer employing selectable taps from the array of delay elements;
   combining the weighted sum with a feedback signal to form a combined signal; and
   deriving a sequence of symbol decisions from the combined signal using a decision element,
      wherein the feed forward equalizer employs an array of multiplexers, and wherein at least one of the selectable taps is shared by multiple multiplexers in said array.

15. The method of claim 14, wherein the feed forward equalizer employs an array of multiplexers, and wherein each multiplexer in said array selects only from non-adjacent taps of the array of delay elements.

16. The method of claim 14, further comprising concurrently selecting said at least one of the selectable taps with multiple multiplexers to increase an effective dynamic range for a respective coefficient.

17. The method of claim 14, wherein the feed forward equalizer employs an array of multipliers, each multiplier multiplying one of said receive signal samples by a respective coefficient to produce a product, and wherein the method further comprises setting or adapting the coefficients for multipliers coupled to a fixed tap before determining which selectable taps the multiplexers select.

* * * * *